United States Patent
Corbin et al.

(10) Patent No.: US 9,131,037 B2
(45) Date of Patent: Sep. 8, 2015

(54) ELECTRONIC DEVICE WITH CONDUCTIVE FABRIC SHIELD WALL

(71) Applicant: Apple Inc., Cupertino, CA (US)

(72) Inventors: Sean S. Corbin, San Jose, CA (US); Taylor H. Gilbert, Sunnyvale, CA (US); Rodney A. Gomez Angulo, Sunnyvale, CA (US); Qingxiang Li, Mountain View, CA (US); Stephen R. McClure, San Francisco, CA (US); Julio C. Quintero, Los Gatos, CA (US); Miroslav Samardzija, Mountain View, CA (US); Robert W. Schlub, Cupertino, CA (US); Jiang Zhu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 309 days.

(21) Appl. No.: 13/655,315

(22) Filed: Oct. 18, 2012

(65) Prior Publication Data
US 2014/0112511 A1    Apr. 24, 2014

(51) Int. Cl.
*H04M 1/02*    (2006.01)
*H05K 9/00*    (2006.01)
*H01Q 1/24*    (2006.01)
*H01Q 1/52*    (2006.01)
*H01Q 21/30*    (2006.01)

(52) U.S. Cl.
CPC .............. *H04M 1/026* (2013.01); *H01Q 1/243* (2013.01); *H01Q 1/523* (2013.01); *H01Q 21/30* (2013.01); *H05K 9/006* (2013.01)

(58) Field of Classification Search
USPC .................... 455/575.1; 257/529; 361/719
See application file for complete search history.

(56) References Cited

U.S. PATENT DOCUMENTS

| | | | |
|---|---|---|---|
| 7,211,739 B1 * | 5/2007 | Brigham et al. | 174/359 |
| 7,435,916 B2 | 10/2008 | Yu | |
| 7,522,108 B2 | 4/2009 | Heng et al. | |
| 7,671,803 B2 | 3/2010 | Neill et al. | |
| 2007/0209833 A1 * | 9/2007 | English | 174/377 |
| 2011/0162879 A1 * | 7/2011 | Bunyan et al. | 174/378 |
| 2011/0222220 A1 | 9/2011 | Murakata et al. | |

(Continued)

FOREIGN PATENT DOCUMENTS

CN    102123186    7/2011

OTHER PUBLICATIONS

Nguyen et al., U.S. Appl. No. 13/527,482, filed Jun. 19, 2012.

*Primary Examiner* — Diane Mizrahi
(74) *Attorney, Agent, or Firm* — Treyz Law Group; G. Victor Treyz; Michael H. Lyons

(57) ABSTRACT

An electronic device may have a housing such as a metal housing. A display may be mounted in the metal housing. Antenna structures may be mounted in the housing under an inactive peripheral portion of the display. Integrated circuits and other electrical components may be mounted in the housing under an active central portion of the display. Shielding structures may be configured to form a wall that extends between the display and the metal housing. The shielding structures may include a sheet of conductive fabric that is shorted to the metal housing and metal chassis structures in the display. The shielding structures may also include a tube of conductive fabric that is capacitively coupled to ground traces in a touch sensor panel. The conductive fabric tube and the sheet of conductive fabric may be shorted to each other using conductive adhesive.

18 Claims, 5 Drawing Sheets

(56) References Cited

U.S. PATENT DOCUMENTS

| | | |
|---|---|---|
| 2012/0198689 A1 | 8/2012 | Schlub et al. |
| 2014/0160699 A1* | 6/2014 | Zhang et al. ............... 361/752 |
| 2014/0268578 A1* | 9/2014 | Dolci et al. ............... 361/719 |

* cited by examiner

ELECTRONIC DEVICE WITH CONDUCTIVE FABRIC SHIELD WALL

BACKGROUND

This relates generally to electronic devices, and, more particularly, to grounding structures for antennas and components in electronic devices.

Electronic devices such as portable computers and handheld electronic devices are often provided with wireless communications capabilities. For example, electronic devices may use long-range wireless communications circuitry to communicate using cellular telephone bands. Electronic devices may use short-range wireless communications links to handle communications with nearby equipment. Electronic devices are also often provided with electronic components such as integrated circuits and other components.

It can be difficult to incorporate antennas and electrical components successfully into an electronic device. Some electronic devices are manufactured with small form factors, so space is limited. Integrated circuits and other components can produce interference signals, which have the potential to disrupt antennas, particularly when sources of interference signals are placed in close proximity to antennas.

It would therefore be desirable to be able to provide improved arrangements for incorporating antennas and electronic components into electronic devices.

SUMMARY

An electronic device may have a housing such as a metal housing. A display may be mounted in the metal housing. Antenna structures may be mounted in the housing under an inactive peripheral portion of the display. Integrated circuits and other electrical components may be mounted in the housing under an active central portion of the display.

Shielding structures may be configured to form a wall that that separates the antenna structures under the inactive portion of the display from components such as integrated circuits under the active portion of the display. The shielding structures may extend vertically between the display and the metal housing.

The shielding structures may include a sheet of conductive fabric that is shorted to the metal housing and that is shorted to conductive components such as metal chassis structures in the display. The sheet of conductive fabric may have a planar vertical portion and bent edge portions. The shielding structures may include a tube of conductive fabric that is capacitively coupled to ground traces in a touch sensor panel. The conductive fabric tube and the sheet of conductive fabric may be shorted to each other using conductive adhesive.

Further features of the invention, its nature and various advantages will be more apparent from the accompanying drawings and the following detailed description of the preferred embodiments.

DETAILED DESCRIPTION

Electronic devices may be provided with antennas for transmitting and receiving wireless radio-frequency signals. Electronic devices may also be provided with electrical components such as integrated circuits and other devices that have the potential to interfere with antenna operation. For example, an integrated circuit such as a display driver integrated circuit may produce fundamental and harmonic signals that can produce or contribute to interference that falls within a communications band of interest. Interference may be generated, for example, that falls within a wireless local area network communications band, a cellular telephone band, or other communications band being used by an electronic device.

Figure 1:
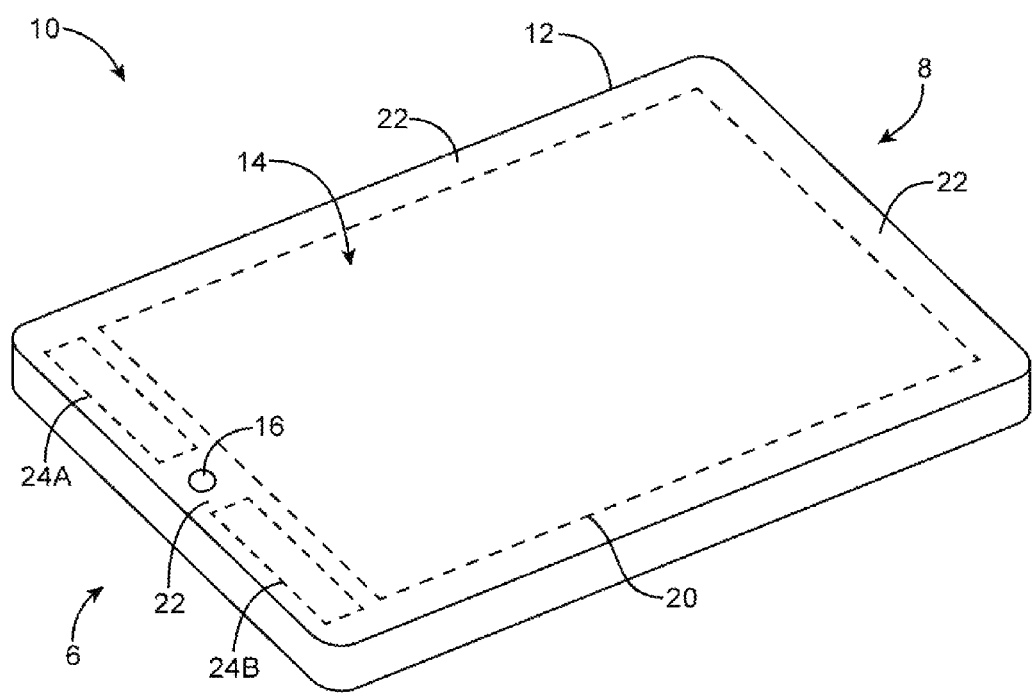
FIG. 1 is a front perspective view of an illustrative electronic device of the type that may be provided with shielding structures for antennas and components in accordance with an embodiment of the present invention.

To reduce the potentially harmful effects of undesired electromagnetic interference, an electronic device such as electronic device 10 of FIG. 1 may be provided with electromagnetic interference shielding structures. These structures, which may sometimes be referred to as grounding structures or shields, may help prevent interference that is produced by an aggressor such as an integrated circuit from being received by a victim such as a radio-frequency receiver.

In the illustrative configuration of FIG. 1, device 10 has the shape of a portable device such as a cellular telephone or other handheld device, tablet computer, or other portable equipment. In general, electronic devices 10 may be desktop computers, computers integrated into computer monitors, portable computers, tablet computers, handheld devices, cellular telephones, wristwatch devices, pendant devices, other small or miniature devices, televisions, set-top boxes, or other electronic equipment.

Device 10 may include one or more antenna resonating elements. For example, device 10 may include one or more wireless local area network antennas such as IEEE 802.11 (WiFi®) antennas operating at 2.4 GHz and/or 5 GHz that are located at one end of device 10 such as end 6 and may include one or more antennas operating at cellular telephone frequencies that are located at an opposing end of device 10 such as end 8. Antennas may also be located at other positions around the periphery of device 10, in the center of device 10, or in other suitable locations.

As shown in FIG. 1, device 10 may have a display such as display 14. Display 14 may be mounted on a front (top) surface of device 10 or may be mounted elsewhere in device 10. Device 10 may have a housing such as housing 12. Housing 12 may have strait walls or curved portions that form the edges of device 10 and a relatively planar portion that forms the rear surface of device 10 (as an example). Housing 12 may also have other shapes, if desired.

Housing 12 may be formed from conductive materials such as metal (e.g., aluminum, stainless steel, etc.), carbon-fiber composite material or other fiber-based composites, glass, ceramic, plastic, other materials, or combinations of these materials. Antennas may be mounted under a radio-transparent portion of display 14, adjacent to a radio-transparent dielectric antenna window in a metal housing, or adjacent to a dielectric housing. Antenna window structures may be formed from plastic, glass, ceramic, or other dielectric materials.

Device 10 may have user input-output devices such as button 16. Display 14 may be a touch screen display that is used in gathering user touch input. The surface of display 14 may be covered using a display cover layer such as a planar cover glass member or a clear layer of plastic or other dielectric member. If desired, the outermost layer of display 14 may be formed from a portion of a color filter layer or other display layer. The central portion of display 14 (shown as region 20 in FIG. 1) may be an active region that contains an array of display pixels for displaying images and that contains a touch sensor array that is sensitive to touch input. The peripheral portion of display 14 such as region 22 may be an inactive region that is free from touch sensor electrodes and display pixels and that does not display images.

A layer of opaque masking material such as opaque ink or plastic may be placed on the underside of display 14 in peripheral region 22 (e.g., on the underside of the cover glass or other display cover layer). The opaque masking material layer may be transparent to radio-frequency signals. The conductive touch sensor electrodes in region 20 and the conductive structures associated with the array of display pixels in region 20 may tend to block radio-frequency signals. However, radio-frequency signals may pass through the display cover layer and the opaque masking layer in inactive display region 22. Antenna structures may therefore transmit and receive antenna signal through inactive display region 22.

For example, antennas such as antenna 24A and 24B of FIG. 1 may transmit and receive radio-frequency wireless signals through inactive border region 22 of display 14 at end 6 of housing 12. Antennas 24A and 24B may be, for example, wireless local area network (WLAN) antennas such as IEEE 802.11 (WiFi®) antennas. There may be any suitable number of wireless local area network antennas in device 10. The configuration of FIG. 1 in which there are two antennas at end 6 of housing 12 is merely illustrative.

With one suitable arrangement, housing 12 may be formed from a metal such as aluminum. In this type of configuration, radio-frequency antenna signals for antennas 24A and 24B may pass primarily or exclusively through inactive portion 22 of display 14 at end 6. If desired, portions of housing 12 may be formed from dielectric in the vicinity of antennas 24A and 24B or housing 12 may be formed entirely from dielectric. Examples of dielectric materials of the type that may be used in forming housing 12 or an antenna window in a metal housing include polycarbonate (PC), acrylonitrile butadiene styrene (ABS), PC/ABS blends, and other plastics (as examples).

Figure 2:
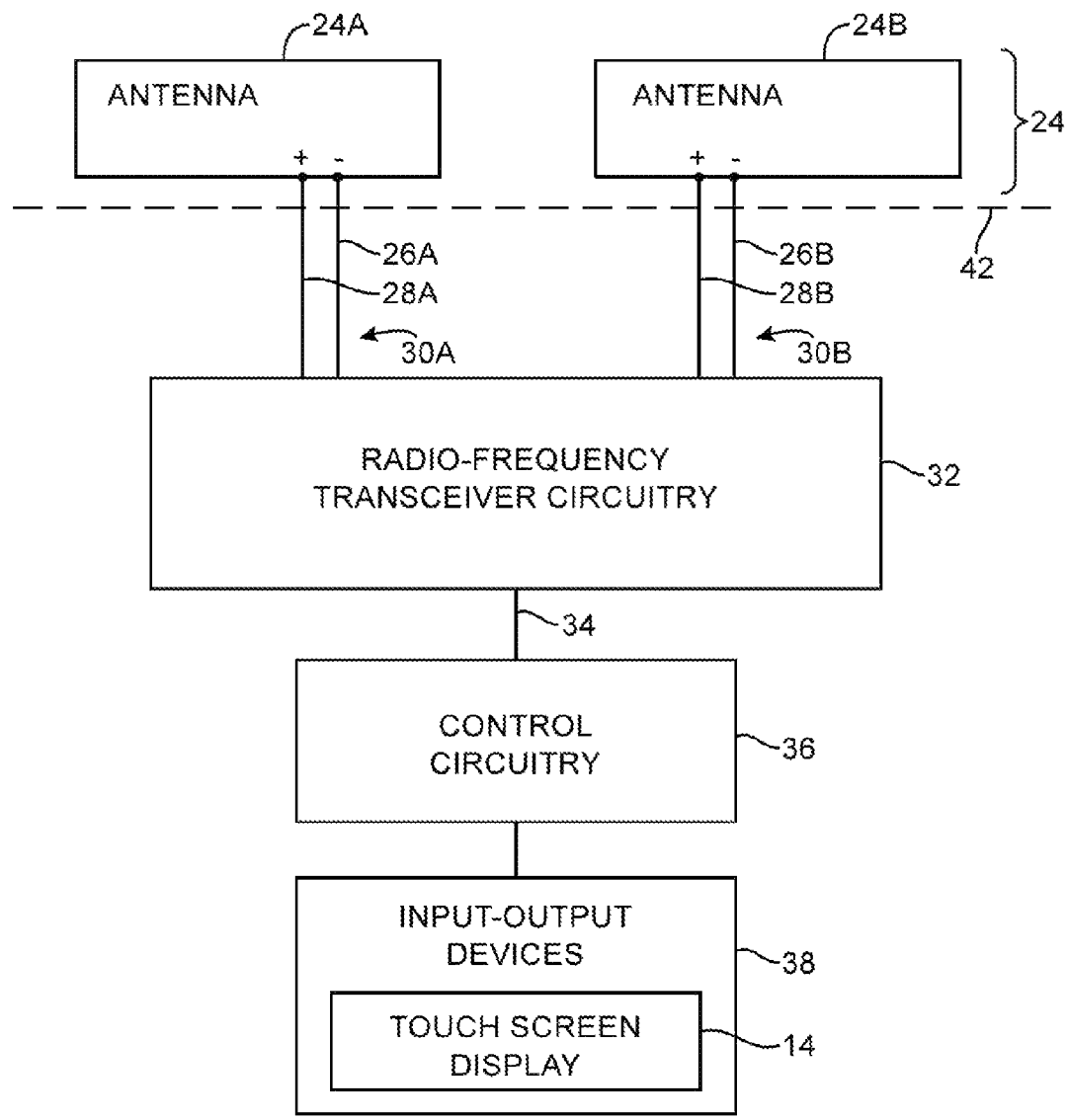
FIG. 2 is a diagram of an illustrative electronic device with antennas, electrical components, and structures for electrically isolating the antennas and electrical components in accordance with an embodiment of the present invention.

A schematic diagram of an illustrative configuration that may be used for electronic device 10 is shown in FIG. 2. As shown in FIG. 2, electronic device 10 may include control circuitry 36. Control circuitry 36 may include storage and processing circuitry for controlling the operation of device 10. Control circuitry 36 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 36 may include processing circuitry based on one or more microprocessors, microcontrollers, digital signal processors, baseband processors, power management units, audio codec chips, application specific integrated circuits, etc.

Control circuitry 36 may be used to run software on device 10, such as operating system software and application software. Using this software, control circuitry 36 may, for example, transmit and receive wireless data, tune antennas to cover communications bands of interest, process proximity sensor signals, adjust radio-frequency transmit powers based on proximity sensor data, control which antennas are active to enhance wireless performance in real time, and may perform other functions related to the operation of device 10.

Input-output devices 38 may be used to allow data to be supplied to device 10 and to allow data to be provided from device 10 to external devices. Input-output devices 38 may include communications circuitry such as wired communications circuitry. Device 10 may also use wireless circuitry such as radio-frequency transceiver circuitry 32 and antenna structures 24 to communicate over one or more wireless communications bands.

Input-output devices 38 may also include input-output components with which a user can control the operation of device 10. A user may, for example, supply commands through input-output devices 38 and may receive status information and other output from device 10 using the output resources of input-output devices 38.

Input-output devices 38 may include sensors and status indicators such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10. Audio components in devices 38 may include speakers and tone generators for presenting sound to a user of device 10 and microphones for gathering user audio input. Devices 38 may include one or more displays such as display 14. Displays may be used to present images for a user such as text, video, and still images. Sensors in devices 38 may include a touch sensor array that is formed as one of the layers in display 14 (i.e., display 14 may be a touch screen display that includes a touch panel having an array of capacitive touch sensor electrodes or other touch sensors such as resistive touch sensors, light-based touch sensors, acoustic touch sensors, or force-sensor-based touch sensors). During operation, user input may be gathered using buttons and other input-output components in devices 38 such as touch pad sensors, buttons, joysticks, click wheels, scrolling wheels, touch sensors such as a touch sensor array in a touch screen display or a touch pad, key pads, keyboards, vibrators, cameras, and other input-output components.

Device 10 may include wireless communications circuitry such as radio-frequency transceiver circuitry 32, power amplifier circuitry, low-noise input amplifiers, passive radio frequency components, one or more antennas such as antenna structures 24, and other circuitry for handling radio frequency wireless signals. The wireless communications circuitry may include radio-frequency transceiver circuits for handling multiple radio-frequency communications bands. For example, wireless communications circuitry in device 10 may include transceiver circuitry 32 for handling cellular telephone communications, wireless local area network signals, and satellite navigation system signals such as signals at 1575 MHz from satellites associated with the Global Positioning System. Transceiver circuitry 32 may handle 2.4 GHz and 5 GHz bands for WiFi® (IEEE 802.11) communications and may handle the 2.4 GHz Bluetooth® communications band. Circuitry 32 may use cellular telephone transceiver circuitry for handling wireless communications in cellular telephone bands such as the bands in the range of 700 MHz to 2.7 GHz (as examples).

The wireless communications circuitry in device 10 can include circuitry for other short-range and long-range wireless links if desired. For example, wireless communications circuitry in device 10 may include wireless circuitry for receiving radio and television signals, paging circuits, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Antenna structures 24 may include one or more antennas such as antennas 24A and 24B. Antenna structures 24 may include inverted-F antennas, patch antennas, loop antennas, monopoles, dipoles, single-band antennas, dual-band antennas, antennas that cover more than two bands, or other suitable antennas. As an example, device 10 may include one or more antennas such as single band or dual band inverted-F antennas formed from metal structures. Metal structures for forming antenna resonating elements for antenna structures 24 may include metal traces formed directly on a plastic carrier or other dielectric carrier or may include metal traces formed on a printed circuit. Printed circuit substrates having metal antenna traces may be supported by a plastic carrier or other dielectric carrier.

To provide antenna structures 24 with the ability to cover communications frequencies of interest, antenna structures 24 may be provided with tunable circuitry. Antenna structures 24 may also include antennas that are not tuned during operation. For example, antennas 24A and 24B may be wireless local area network antennas that cover 2.4 GHz and 5 GHz bands without using antenna tuning circuitry.

During operation, path 34 may be used to convey data between control circuitry 36 and radio-frequency transceiver circuitry 32 (e.g., when transmitting wireless data or when receiving and processing wireless data).

Transceiver circuitry 32 may be coupled to antenna structures 24 by signal paths such as signal paths 30A and 30B. Signal paths 30A and 30B may each include one or more transmission lines. Signal path 30A may be a transmission line including positive signal path 28A and ground signal path 26A. Signal path 30B may be a transmission line including positive signal path 228B and ground signal path 26B.

Transmission line paths 30A and 30B may form parts of a coaxial cable, parts of a microstrip transmission line, or parts of other transmission line structures. The impedance of transmission lines 30A and 30B may be 50 ohms (as an example). Matching network circuits formed from components such as inductors, resistors, and capacitors may be used in matching the impedance of antenna structures 24 to the impedances of transmission lines 30A and 30B. Matching network components may be provided as discrete components (e.g., surface mount technology components) or may be formed from housing structures, printed circuit board structures, traces on plastic supports, etc.

Transmission line 30A may be coupled to antenna feed structures associated with antenna 24A and transmission line 30B may be coupled to antenna feed structures associated with antenna 24B. As an example, antenna structures 24A and 24B may each include an inverted-F antenna having an antenna feed with a positive antenna feed terminal (+) and a ground antenna feed terminal (−). Other types of antenna feed arrangements may be used if desired. The illustrative feeding configuration of FIG. 2 is merely illustrative.

To help electromagnetically isolate antenna structures 24 from other components in device, one or more electromagnetic interference shielding structures may be provided in device 10 such as shielding structures 42. Structures 42 may be formed from metal housing structures, conductive portions of a display or other components, metal tape or other flexible metal structures, sheet metal structures, or other conductive structures. As an example, conductive structures formed from conductive fabric may be used in forming shielding structures 42. Shielding structures 42 may be coupled to a metal housing or other conductive structure within device 10 that serves as a source of ground potential (e.g., a metal structure such as metal housing 12 may serve as ground) and may therefore sometimes be referred to as grounding structures. Shielding structures 42 may help prevent undesired electromagnetic interference. As an example, shielding structures 42 may help prevent radio-frequency interference signals that are generated by circuitry 36 or 38 from being received by antennas 24A and 24B and thereby passed to circuitry 32.

Figure 3:
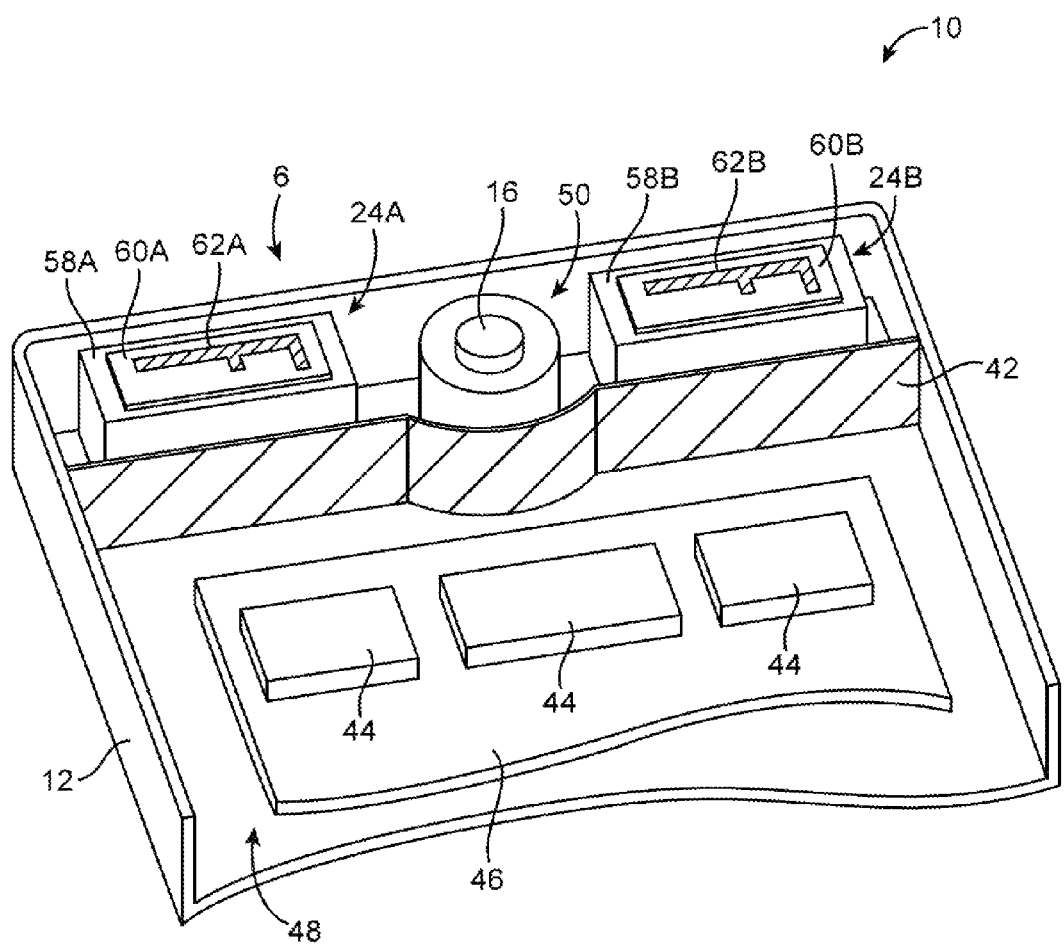
FIG. 3 is a perspective view of an interior end portion of an electronic device in accordance with an embodiment of the present invention.

FIG. 3 is a top view of an end portion of device 10 of FIG. 1 showing how shielding structures 42 may be interposed between central interior portion 48 of housing 12 in device 10 and end interior portion 50 of housing 12 at end 6 of device 10. Interior portion 48 may include components such as components 44. Components 44 may include circuitry of the type show in FIG. 2 (e.g., one or more integrated circuits such as memory and processor circuits, display driver integrated circuits, etc.). Components 44 may be mounted on one or more substrates such as substrate 46. Substrate 46 may be a rigid printed circuit board (e.g., a fiberglass-filled epoxy board), a flexible printed circuit (e.g., a printed circuit having a flexible printed circuit substrate such as a layer of polyimide or a sheet of other flexible polymer), a plastic carrier, or other dielectric support structure. Components such as battery structures, display and touch sensor structures, and other devices may also be mounted in region 48.

Components such as button 16 may be mounted in region 50. Antennas such as antennas 24A and 24B may also be mounted within region 50. As shown in FIG. 3, antenna 24A may have a support structure such as dielectric support structure 58A. Antenna 24B may have a support structure such as dielectric support structure 58B. Support structures 58A and 58B may be formed from materials such as glass, ceramic, and plastic. As an example, support structures 58A and 58B may be formed from hollow or solid molded plastic parts.

Antenna 24A may include flexible printed circuit 60A. Flexible printed circuit 60A may include a substrate and patterned metal traces such as traces 62A. Metal traces 62A may be patterned to form antenna structures such as an inverted-F antenna resonating element.

Antenna 24B may include flexible printed circuit 60B. Flexible printed circuit 60B may include a flexible printed circuit substrate having patterned metal traces 62B. Metal traces 62B may be patterned to form antenna structures such as an inverted-F antenna resonating element.

Flexible printed circuits 60A and 60B may be mounted to support structures 58A and 58B using foam, adhesive, or other mounting structures.

During operation, the presence of shielding structures 42 may prevent interference signals from components 44 in region 48 from being received by antennas 24A and 24B and may help block antenna signals from antennas 24A and 24B that might otherwise pass into region 48.

Figure 4:
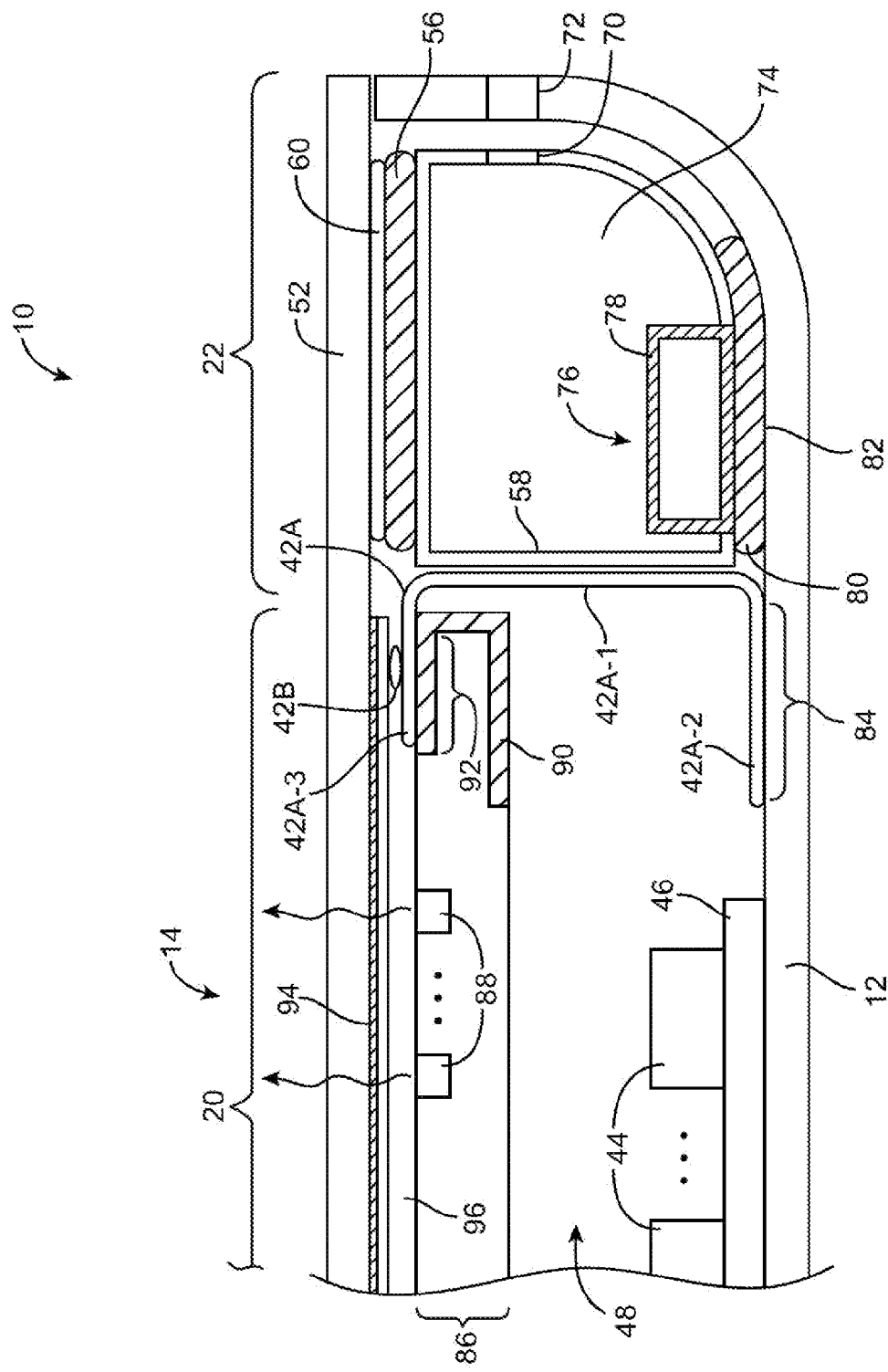
FIG. 4 is a cross-sectional side view of a portion of an electronic device showing how a shielding structure may be formed between an antenna and electrical device components in accordance with an embodiment of the present invention.

A cross-sectional side view of device 10 at an end such as end 6 of FIG. 3 is shown in FIG. 4. In the example of FIG. 4, a flexible printed circuit such as flexible printed circuit 60 (e.g., flexible printed circuit 60A or 60B of FIG. 3) is being supported by dielectric carrier 58 (e.g., carrier 58A or carrier 58B of FIG. 3). Antenna resonating element traces for an antenna may be contained within flexible printed circuit 60, as described in connection with traces 62A and 62B of antennas 24A and 24B of FIG. 4. Display 14 may include a display module such as display module 86 and a display cover layer such as display cover layer 52. Display cover layer 52 may be formed from a layer of clear material such as a transparent glass sheet or a transparent plastic member. Opaque masking material may be formed on the underside of display cover layer 52 in inactive region 22 of display 14. In active display region 20, display module 86 of display 14 may use an array of display pixels 88 for displaying images for a user.

To ensure consistent antenna performance from device to device, a biasing structure such as foam layer 56 may be interposed between antenna resonating element flexible printed circuits such as flexible printed circuit 60 and dielectric carriers such as dielectric carrier 58. A foam layer such as foam layer 56 may press antenna resonating element flexible printed circuit 60 upwards into a known position relative to display cover layer 52, thereby helping to ensure mounting consistency and reducing antenna performance fluctuations due to manufacturing variations.

Dielectric carrier 58 may be hollow. For example, interior portion 74 of dielectric carrier 58 may be filled with air. Components may be mounted within the interior of dielectric carrier 58. For example, speaker driver 76 may be mounted within interior 74 of dielectric carrier 58. During operation, speaker driver 76 may produce sound (i.e., cavity 58 may serve as a speaker box for driver 76). Interior 74 of speaker box 58 may serve as speaker box cavity. Openings such as opening 70 in speaker box carrier 58 and opening 72 in housing 12 may be used to allow sound from speaker driver 76 to exit the interior of device 10.

Portions of speaker driver 76 such as housing 78 or other structures in speaker driver 76 may be formed from conductive structures such as metal structures. Conductive foam 82 may be used to form a conductive grounding path the grounds speaker driver 76 to housing 12. Conductive foam 82 may also serve as a biasing structure that helps push carrier 58 (and therefore flexible printed circuit antenna resonating element 60 upwards against the interior of display cover glass 52.

Display module 86 may have one or more display layers. For example, display module 86 may have liquid crystal display layers such as a light guide plate, diffusing films, prism films, and other backlight structures, a thin-film-transistor layer, a liquid crystal layer, a color filter layer, and upper and lower polarizer layers. These layers may be assembled to from a module. The module may include plastic chassis structures (sometimes referred to as a p-chassis) and metal chassis structures (sometimes referred to as an m-chassis). Display module 86 may, for example, have a metal chassis such as m-chassis structure 90 of FIG. 4. If desired, display module 86 may be formed using an array of organic light-emitting diodes or other display structures (e.g., structure for an electrophoretic display, structures for an electrowetting display, structures for a plasma display, etc.). The use of liquid crystal display pixels in forming display module 86 is merely illustrative.

In the illustrative configuration of FIG. 4, display 14 is a touch screen display that includes touch panel 96. A layer of adhesive such as adhesive layer 94 may be used to attach touch panel 96 to the underside of display cover layer 52 in active area 20. Touch panel 96 may be formed from a substrate such as a layer of polyimide or other flexible polymer layer. Indium tin oxide capacitive touch sensor electrodes or other touch sensor structures may be formed on touch panel 96. If desired, touch sensor structures such as an array of capacitive touch sensor electrodes may be formed directly on the underside of display cover layer 52 or other layers in display 14. The configuration of FIG. 4 in which display 14 has been provided with touch sensor functionality by attaching a touch panel to the inner surface of display cover layer 52 is merely illustrative.

Display module 86 may include a rectangular array of display pixels 88 in the central active portion of display 14. For example, in a configuration in which display module 86 is a liquid crystal display module, display pixels 88 may each include electrode structures and an associated thin-film transistor for controlling signals applied to the electrode structures. The magnitude of the signals applied to the electrode structures may be used to adjust the optical properties of the liquid crystal layer and thereby control the amount of light that is transmitted through each pixel of the display.

In general, shielding structures 42 may be formed from one or more pieces of conductive material. In the illustrative configuration of FIG. 4, shielding structures 42 of FIG. 3 have been implemented using conductive structures such as conductive structures 42A and 42B. Conductive structures 42A may be formed from a layer of metal tape, a thin sheet metal layer, or a layer of conductive fabric (as examples). Shielding layer portion 42B may be formed from a tube of conductive fabric or other conductive material (e.g., metal tape, etc.).

As shown in FIG. 4, conductive structures 42A may be formed from a sheet of material having a first planar portion such as vertical planar portion 42A-1. Vertical planar portion 42A-1 may extend vertically between structures such as conductive housing wall 12 in the lower portion of device 10 and structures such as display 14 (e.g., touch panel 96 of display 14) in the upper portion of device 10. Bends may be formed in the sheet of material used to form conductive structures 42A. For example, structures 42A may have a lower end that is bent so that horizontal portion 42A-2 of structures 42A extends along metal housing wall 12 and thereby grounds conductive structures 42A to housing 12. Structures 42A may also have an upper end that is bent to form horizontally extending portion 42A-3.

If desired, conductive adhesive may be used in coupling conductive structures 42A to adjacent metal structures in device 10. For example, conductive adhesive may be interposed between portion 42A-2 and housing wall 12 and/or portions 42A-3 and portions of display module 86.

Figure 5:
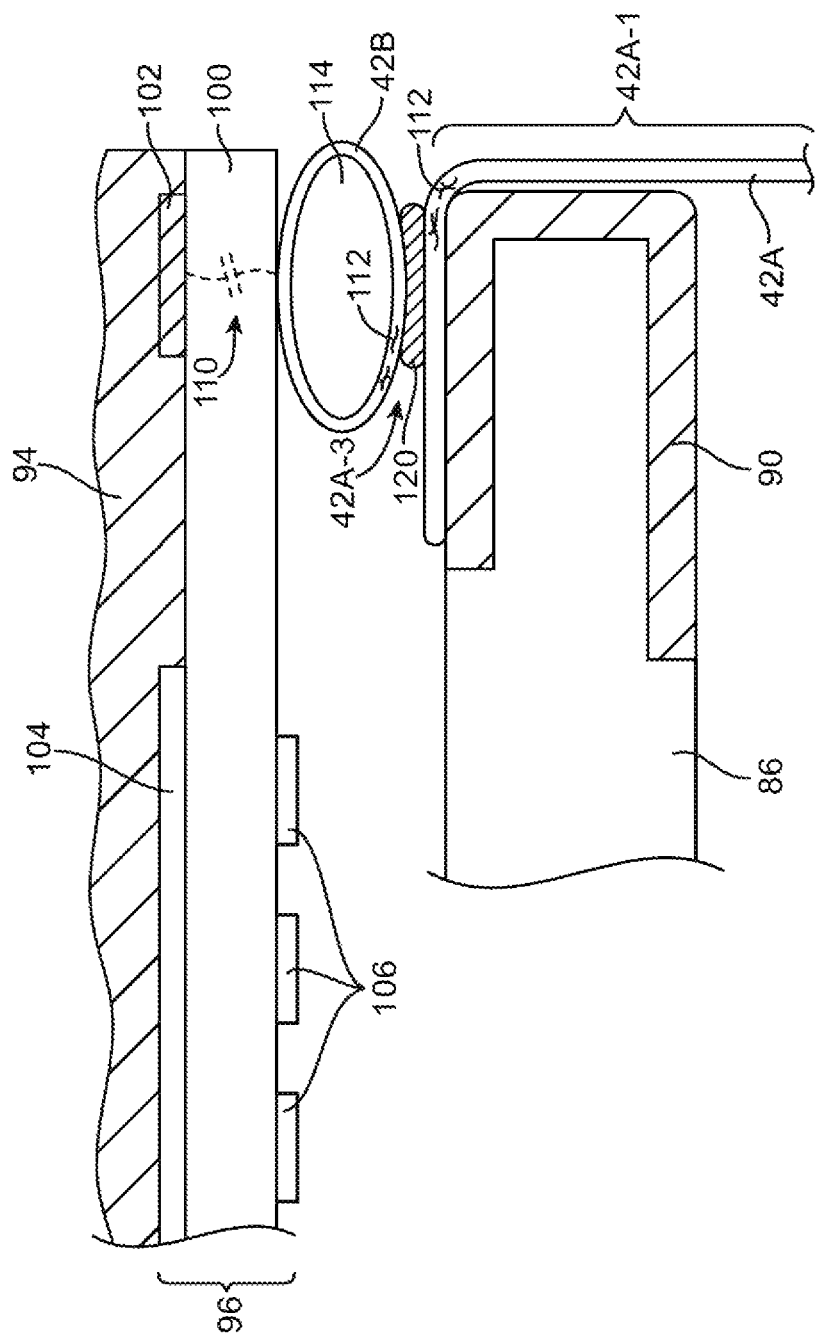
FIG. 5 is a cross-sectional side view of illustrative shielding structures that include a sheet of conductive fabric and a tube-shaped conductive fabric structure that is capacitively coupled to a ground conductor in a component such as a touch sensor panel in accordance with an embodiment of the present invention.

As shown in FIG. 5, horizontally extending portion 42A-3 of structures 42A may be electrically connected to an overlapping portion of display module 86 such as metal chassis 90. This grounds metal chassis 90 to housing 12. An optional layer of conductive adhesive may be used in coupling portion 42A-3 of structures 42A to metal chassis 90. Conductive structures 42B may be electrically grounded to housing 12 using structures 42A. If desired, conductive adhesive such as conductive adhesive layer 120 may be interposed between structures 42B and structures 42A to help attach and short structures 42B to structures 42A.

Touch sensor layer 96 may include a touch sensor substrate layer such as substrate 100. Substrate 100 may be formed from a layer of polyimide or other polymer. Capacitive touch sensor electrodes such as indium tin oxide electrodes or electrodes formed from other conductive transparent material may be formed on the upper and/or lower surfaces of substrate 100. For example, capacitive touch sensor electrodes 104 may be formed on the upper surface of substrate 100 and capacitive touch sensor electrodes 106 may be formed on the lower surface of substrate 100. Adhesive 94 may be used to attach touch sensor 86 to the underside of display cover layer 52 (FIG. 4).

Conductive structure 42B may be formed from a hollow tube of conductive fabric that runs along the edge of touch sensor 96 (i.e., along an axis that extends into the page of FIG. 5). Touch sensor layer 96 may include ground conductors such as ground traces 102 on substrate 100. Conductive shielding structure 42B may be electrically coupled to ground traces 102 via capacitive coupling, as illustrated schematically by capacitance 110 of FIG. 5. By capacitively coupling touch sensor ground traces 102 conductive structures 42B, traces 102 may be grounded to housing 12 through conductive structures 42A, thereby shorting structures 42 to the top of device 10 (at display 14). Structures 42A may also be shorted to the bottom of device 10 at housing 12, so that structures form a vertical conductive shielding wall.

The foregoing is merely illustrative of the principles of this invention and various modifications can be made by those skilled in the art without departing from the scope and spirit of the invention.

What is claimed is:

1. An electronic device, comprising:
   a housing having a first interior portion and a second interior portion;
   antenna structures in the first interior portion;
   electrical components in the second interior portion;
   conductive fabric structures that form a shielding wall separating the first interior portion from the second interior portion, wherein the conductive fabric structures comprise a sheet of conductive fabric and a tube of conductive fabric; and
   conductive adhesive that attaches the tube of conductive fabric to the sheet of conductive fabric.

2. The electronic device defined in claim 1 wherein the housing comprises a metal housing and wherein the sheet of conductive fabric is shorted to the metal housing.

3. The electronic device defined in claim 2 further comprising a display, wherein the conductive fabric structures extend between the metal housing and the display.

4. The electronic device defined in claim 2 further comprising a touch panel having a ground trace and having a dielectric substrate, wherein the tube of conductive fabric is mounted adjacent to the dielectric substrate to capacitively couple the tube of conductive fabric to the ground trace.

5. The electronic device defined in claim 4 further comprising a display module having a metal chassis structure, wherein the sheet of conductive fabric has a portion that overlaps that metal chassis structure.

6. The electronic device defined in claim 5 wherein the sheet of conductive fabric has a vertical planar portion that extends from the metal housing towards the display and wherein the sheet of conductive fabric is bent at an angle with respect to the vertical planar portion to form the portion of the sheet of conductive fabric that overlaps the metal chassis structure.

7. The electronic device defined in claim 6 wherein the sheet of conductive fabric further has a portion that runs along an inner surface of the metal housing.

8. The electronic device defined in claim 1, further comprising:
   a ground structure, wherein the conductive fabric structures are electrically shorted to the ground structure.

9. The electronic device defined in claim 8, wherein the ground structure comprises a conductive portion of the housing.

10. The electronic device defined in claim 1, further comprising an electrical component having a dielectric layer and a metal trace.

11. An electronic device, comprising:
    a housing having a first interior portion and a second interior portion;
    antenna structures in the first interior portion;
    electrical components in the second interior portion;
    conductive fabric structures that form a shielding wall separating the first interior portion from the second interior portion; and
    an electrical component having a dielectric layer and a metal trace, wherein the conductive fabric structures are capacitively coupled to the metal trace.

12. The electronic device defined in claim 11 wherein the electrical component having the dielectric layer and the metal trace comprises a touch panel and wherein the metal trace comprises a ground trace in the touch panel.

13. An electronic device, comprising:
    a housing having a first interior portion and a second interior portion;
    antenna structures in the first interior portion;
    electrical components in the second interior portion; and
    conductive fabric structures that form a shielding wall separating the first interior portion from the second interior portion, wherein the electrical components comprise at least one integrated circuit in the second interior portion and the conductive fabric structures are configured to shield the antenna structures from the electrical components.

14. An electronic device, comprising:
    a housing having a first interior portion and a second interior portion;
    antenna structures in the first interior portion;
    electrical components in the second interior portion;
    conductive fabric structures that form a shielding wall separating the first interior portion from the second interior portion, wherein the antenna structures include a first wireless local area network antenna and a second wireless local area network antenna; and
    a button located between the first wireless local area network antenna and the second wireless local area network antenna.

15. An electronic device, comprising:
    a housing having a first interior portion and a second interior portion;
    antenna structures in the first interior portion;
    electrical components in the second interior portion; and
    conductive fabric structures that form a shielding wall separating the first interior portion from the second interior portion, wherein the antenna structures include first and second antennas, the first antenna comprises a first flexible printed circuit with first patterned antenna traces, and the second antenna comprises a second flexible printed circuit with second patterned antenna traces.

16. The apparatus defined in claim 15 further comprising first and second dielectric carriers that respectively support the first and second flexible printed circuits.

17. The apparatus defined in claim 16 further comprising:
    a display cover layer; and
    foam interposed between the first dielectric carrier and the first flexible printed circuit that biases the first flexible printed circuit against the display cover layer.

18. An electronic device, comprising:
    a housing having a first interior portion and a second interior portion;
    antenna structures in the first interior portion;

electrical components in the second interior portion;
conductive fabric structures that form a shielding wall separating the first interior portion from the second interior portion; and
a display, wherein the first interior portion is formed under an inactive portion of the display.

* * * * *